(12) United States Patent
Zhou et al.

(10) Patent No.: US 6,807,520 B1
(45) Date of Patent: Oct. 19, 2004

(54) SYSTEM AND METHOD FOR SIMULATION OF AN INTEGRATED CIRCUIT DESIGN USING A HIERARCHICAL INPUT NETLIST AND DIVISIONS ALONG HIERARCHICAL BOUNDARIES THEREOF

(75) Inventors: Yo Ng Zhou, Mountain View, CA (US); Antony Fan, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 623 days.

(21) Appl. No.: 09/808,339

(22) Filed: Mar. 13, 2001

Related U.S. Application Data

(60) Provisional application No. 60/256,814, filed on Dec. 18, 2000, and provisional application No. 60/254,838, filed on Dec. 11, 2000.

(51) Int. Cl.$^7$ ............................................. G06F 17/50
(52) U.S. Cl. ............................. 703/14; 703/17; 716/3; 716/7
(58) Field of Search ..................... 703/14, 17; 716/5, 716/7, 6, 8, 9, 3

(56) References Cited

U.S. PATENT DOCUMENTS

| | | | | |
|---|---|---|---|---|
| 5,555,201 A | * | 9/1996 | Dangelo et al. ................ | 716/1 |
| 5,838,947 A | * | 11/1998 | Sarin ............................ | 703/14 |
| 6,108,494 A | * | 8/2000 | Eisenhofer et al. ........... | 703/14 |
| 6,339,836 B1 | * | 1/2002 | Eisenhofer et al. ............ | 716/5 |
| 6,446,239 B1 | * | 9/2002 | Markosian et al. ............ | 716/2 |
| 6,449,761 B1 | * | 9/2002 | Greidinger et al. ........... | 716/11 |

* cited by examiner

Primary Examiner—Thai Phan
(74) Attorney, Agent, or Firm—Bever, Hoffman & Harms, LLP; Jeanette S. Harms

(57) ABSTRACT

A system and a method for performing circuit simulation on a integrated circuit design that is represented by a hierarchical netlist. The system and method utilize, in one embodiment, an event driven simulator that divides or "cuts" along the hierarchical boundaries of the input netlist in order to produce subcircuits that are then converted into their Thevenin equivalents. Once a Thevenin equivalent is computed, matrix computations are used to compute the cut node voltages and sensitivity vectors may be used to then determine the internal node voltages. This is done for each event. In the event driven example, a group of leaf cells are identified that are touched by a given event. This group is then cut based on the hierarchical boundaries of the input netlist. The system maintains dynamic node voltages across the entire netlist and also maintains instance specific dynamic information for each cell. However, static information for a given cell is shared for each cell instance thereby reducing memory resources required to perform simulation for input hierarchical netlists that contain repeated cell instances. The present invention provides an accurate voltage and current simulation while requiring reduced memory resources for hierarchical netlists that contain repeated cell instances.

21 Claims, 10 Drawing Sheets

$$\begin{bmatrix} \sum_s g_{1,1,s} & \sum_s g_{1,2,s} & \cdots & \sum_s g_{1,n,s} \\ \sum_s g_{2,1,s} & \sum_s g_{2,2,s} & \cdots & \sum_s g_{2,n,s} \\ \vdots & \vdots & \ddots & \vdots \\ \sum_s g_{m,1,s} & \sum_s g_{m,2,s} & \cdots & \sum_s g_{m,n,s} \end{bmatrix} \begin{bmatrix} dv_1 \\ dv_2 \\ \vdots \\ dv_n \end{bmatrix} = \begin{bmatrix} -\sum_s i_{1,s} \\ -\sum_s i_{2,s} \\ \vdots \\ -\sum_s i_{m,s} \end{bmatrix} \quad \substack{\leftarrow 150 \\ EQ(2)}$$

FIG. 3

SYSTEM AND METHOD FOR SIMULATION OF AN INTEGRATED CIRCUIT DESIGN USING A HIERARCHICAL INPUT NETLIST AND DIVISIONS ALONG HIERARCHICAL BOUNDARIES THEREOF

RELATED US APPLICATIONS

This patent application claims priority to U.S. provisional patent application, Ser. No. 60/254,838, filed Dec. 11, 2000, entitled "Hierarchical Simulation," by Fan et al. and also U.S. provisional patent application, Ser. No. 60/256,814, filed Dec. 18, 2000, entitled "Hierarchical Simulation," by Fan et al.

FIELD OF THE INVENTION

The field of the present invention pertains to computer implemented integrated circuit simulators. More specifically, the field of the present invention pertains to circuit simulators that access an integrated circuit design that is represented by a hierarchical netlist.

BACKGROUND OF THE INVENTION

Due to the great complexity of modern integrated circuit designs, they re represented by designers as "netlists." Netlists contain descriptions of circuitry and the manner in which the circuitry is connected together. These netlists are stored in various computer readable medium in such a way that they can be processed by computer systems. Circuit simulators are computer implemented processes that can simulate the expected operation and behavior of a circuit design by applying a set of input signals to the netlist and propagating the resultant signals through the netlist to its output nodes. Circuit simulators can be used, in one way, to verify that a netlist properly performs its specified operation and/or to measure the performance of the design.

In the past, netlists were completely flattened in order to perform circuit simulation. Flattening is the process of taking a netlist that may be represented in multiple levels of a structured hierarchy and transforming it into a netlist that contains only leaf cells of a single level. Flattening is required because conventional circuit simulators perform subcircuit divisions based on channel connect boundaries. A netlist is divided into multiple subcircuits (e.g., "partitions") in order to reduce the complexity of the matrix computations that are required of the simulation processes. In other words, the netlist is broken down into smaller pieces to more readily perform the manageable matrix computations of each piece. The matrix computations result from multiple node voltage equations that need to be solved by the circuit simulator.

A "channel connect" boundary attempts to divide a netlist into a subcircuit based on the drain-to-source connections of the transistors that make up the netlist. According to a channel connect boundary, drain-to-source connections have strong electrical coupling where drain-to-gate or source-to-gate connections have weak electrical coupling.

In more specific terms, in order to process an input event (e.g., for an event-driven simulator), the computer system needs to define a group of leaf cells that are touched by the event. Conventional simulators use a channel connect boundary partition process to determine this group of leaf cells and grouping is based on the source-to-drain connections of the circuit elements, e.g., for CMOS technology. Graph techniques are applied to define the partition and, according to these techniques, source-to-drain connections are followed until gates are reached. The circuit behavior of the partitions are then separately simulated, e.g., matrix computations are performed. Because the channel boundary partitions can be different for each event, the computer system requires that the entire netlist be completely flattened to leaf cells in order to property perform the circuit simulation.

However, the netlist representations of modern integrated circuit designs may contain multiple millions of leaf cells. Therefore, requiring that the entire netlist be flattened in order to perform simulation requires that the computer system contain a very large (and expensive) amount of computer memory resources in order to store and flatten the entire design. As a result, conventional circuit simulators operate on expensive and complex computer systems. It would be advantageous to provide a circuit simulator that produced accurate results but did not require the vast computer memory resources required of conventional circuit simulators.

SUMMARY OF THE INVENTION

Accordingly, the present invention provides a circuit simulator that produces accurate results but does not require the large computer memory resources required of conventional circuit simulators. The present invention further provides a circuit simulator, as above, that operates on an integrated circuit design that is represented by a hierarchical netlist and does not require flattening of the entire netlist in order to perform simulation. Further, the present invention provides a circuit simulator that advantageously utilizes the defined hierarchical boundaries of the netlist in order to produce the subcircuits that are used to simplify the matrix computations required of simulation. By using the defined hierarchical boundaries of the netlist in order to produce the subcircuits, many of the structural information of a cell can be shared among the simulation computations that utilize instances of the same cell, thereby reducing the amount of memory required to perform circuit simulation. These and other advantageous of the present invention not discussed above will become clear within discussions of the present invention presented herein.

A system and a method are described for performing circuit simulation on a integrated circuit design that is represented by a hierarchical netlist. The system and method utilize, in one embodiment, an event driven simulator that divides or "cuts" along the hierarchical boundaries of the input netlist in order to produce subcircuits that are then converted into Thevenin equivalent circuit models. Once a Thevenin equivalent circuit model is computed, matrix equations/computations are used to compute the cut node voltages and then sensitivity vectors may be used to determine the internal node voltages. The cut node voltages are stored in a flattened cut node voltage data structure that is dynamic. Internal node voltages may be stored in instance specific dynamic data structures. This is done for each event. In the event driven example, a group of leaf cells are identified that are touched by a given event. This group is then cut based on the hierarchical boundaries of the input netlist.

The system maintains the dynamic node voltages across the entire netlist and also maintains instance specific dynamic information for each cell. However, static information for a given cell is shared for each cell instance thereby reducing memory resources required to perform simulation for input hierarchical netlists that contain repeated cell instances. The present invention provides an accurate voltage and current simulation while requiring reduced memory resources for hierarchical netlists that contain repeated cell instances.

More specifically, an embodiment of the present invention includes a computer implemented method of simulating an integrated circuit design comprising the steps of: a) accessing an input netlist describing the integrated circuit design, the input netlist organized in a hierarchical fashion; b) in response to an event, determining a group of leaf cells of the netlist that are effected by the event; c) of the group of leaf cells, dividing the group into stages based on hierarchical boundaries as defined in the netlist; d) transforming each of the stages into a separate circuit model; e) using the circuit models to compute cut node voltages of the stages and recording, in computer memory, the cut node voltages; f) repeating the steps b)–e) for multiple events.

Embodiments include the above and wherein the circuit models are Thevenin equivalent circuit models. An embodiment of the present invention also includes a computer system operable according to the simulation method described above.

BRIEF DESCRIPTION OF THE DRAWINGS

The present invention is illustrated by way of example and not by way of limitation, in the figures of the accompanying drawings and in which like reference numerals refer to similar elements and in which:

FIG. 3 is a matrix, G, that is formed by summing corresponding admittances from each subcircuit over the set of S subcircuits in accordance with an embodiment of the present invention.

DETAILED DESCRIPTION OF THE INVENTION

Reference will now be made in detail to the embodiments of the invention, system and method for simulation of an integrated circuit design using a hierarchical input netlist and divisions along hierarchical boundaries thereof, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Notation and Nomenclature

Figure 9:
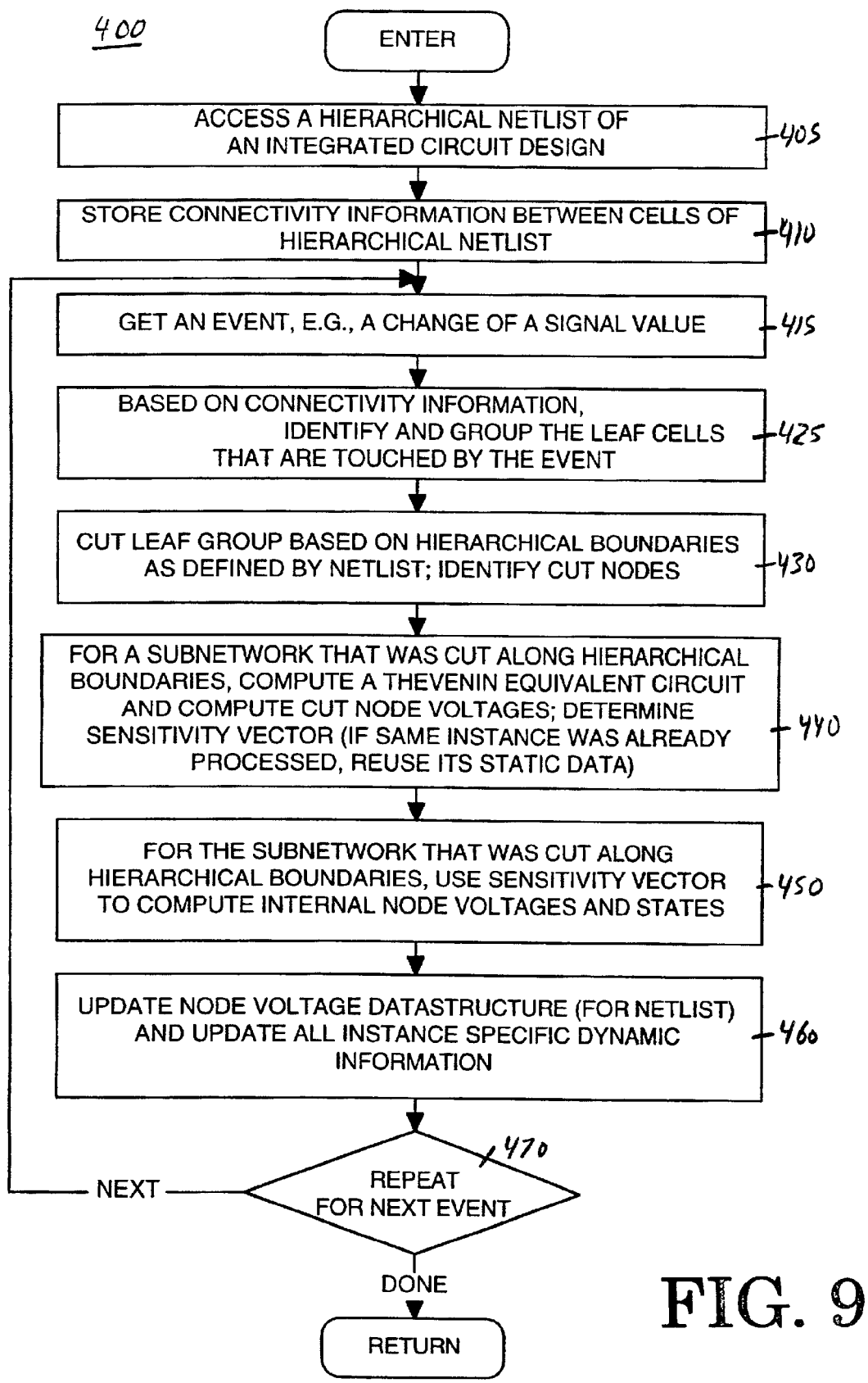
FIG. 9 is a flow diagram of steps of an event-driven circuit simulator in accordance with an embodiment of the present invention.

Some portions of the detailed descriptions which follow are presented in terms of procedures, steps, logic blocks, processing, and other symbolic representations of operations on data bits within a computer memory, e.g., flow diagram 400 of FIG. 9. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "simulating," "translating," "instantiating," "determining," "displaying," "recognizing," or the like, sometimes refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

General Purpose Computer System Platform 112

Figure 1:
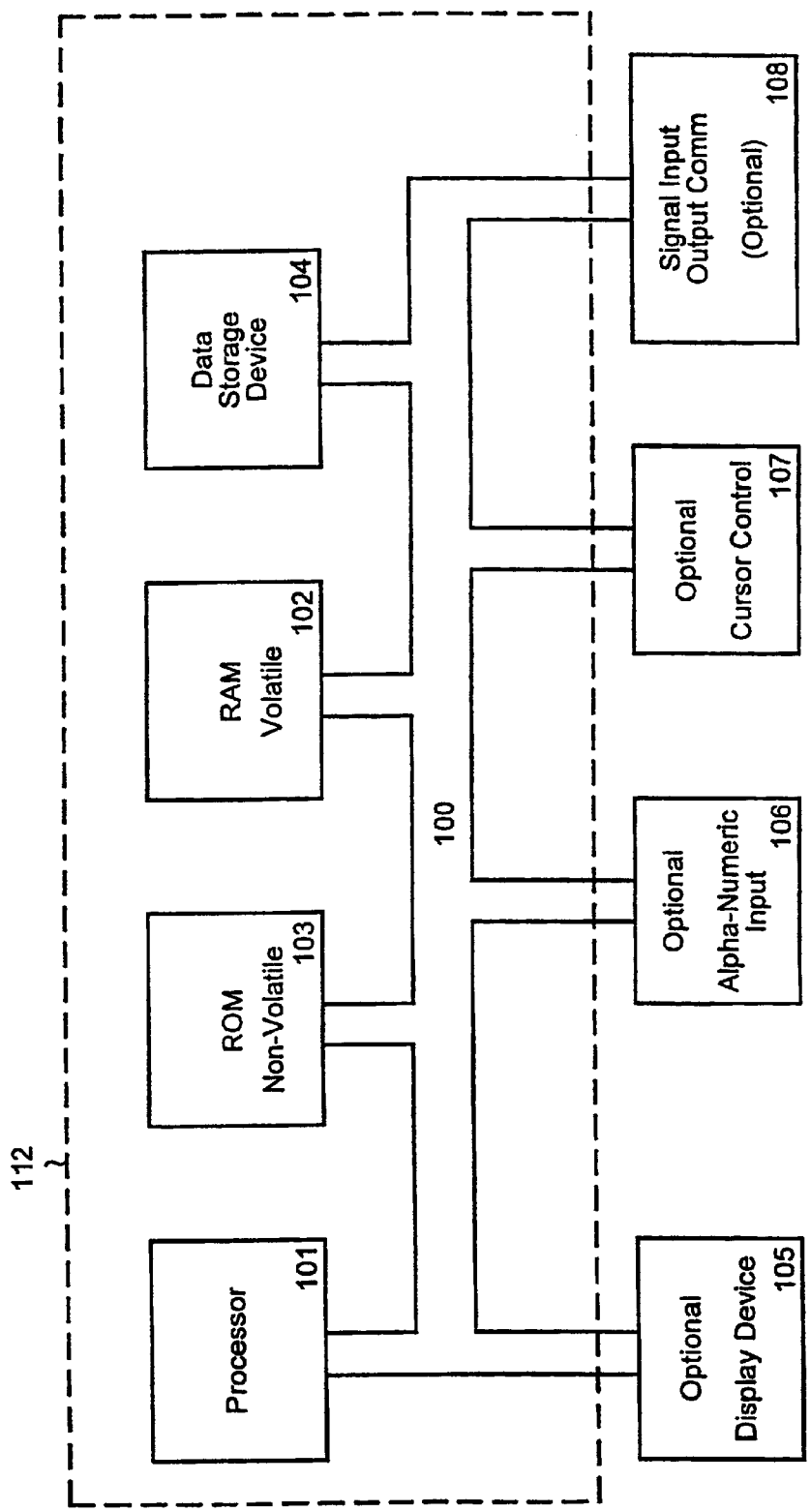
FIG. 1 illustrates a general purpose computer system that can be used as a platform for embodiments of the circuit simulator of the present invention.

Referring to FIG. 1, a general purpose computer system 112 is illustrated that may function as a platform for one or more embodiments of the present invention. Within the following discussions of the present invention, certain processes and steps are discussed that are realized, in one embodiment, as a series of instructions (e.g., software program) that reside within computer readable memory units of system 112 and executed by processors of system 112.

When executed, the instructions cause computer system 112 to perform specific actions and exhibit specific behavior which is described in detail to follow.

In general, the system 112 includes an address/data bus 100 for is, communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101.

System 112 of FIG. 1 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

In the nomenclature herein, a "partition" is a portion of a circuit that might be simulated as a unit. Once all partitioning is done, the resultant partitions are called "stages." Hence, a set of partitions is a temporary state along the path to create stages.

A "circuit element" is a transistor, resistor, inductor, capacitor, or other device that can be modeled in a circuit simulation. The electrical characteristics of circuit elements can be specified by many different methods, including a simple linear equation, a set of equations, and a lookup table.

The term "leaf cell" is used to mean a set of circuit elements as specified by the circuit designer as a reusable unit. Examples of leaf cells are: a two-input NAND gate; a four-input NOR gate; a sense amp; and two-to-one multiplexor. An important aspect of embodiments of the present invention is the utilization of designer-specified boundaries within the circuit. That is, embodiments of the present invention do not attempt to repartition the input circuit design, but rather uses the implied boundaries between circuit elements as specified in the hierarchical description that the circuit designer naturally uses.

Channel connect partitioning divides a circuit into a multiplicity of partitions, where node connected by a "channel" are put into the same partition. For MOS transistors, the source and drain are in the same partition, and the gate is in a different partition (unless the gate is channel connected by other circuit elements to the source or drain, but not through voltage sources or negligible parasitic elements).

Resistors and capacitors are considered channels, and therefore both terminals are placed in the same partition according to channel connect. Capacitors with one node tied to a constant voltage simply have their capacitance added to the node capacitance of the other node and are otherwise eliminated from the circuit. Subsequent processing of floating capacitors (e.g., capacitors with neither terminal tied to a supply voltage) does the following: 1) discards "small" floating capacitors, but compensates by adding the capacitance value to the node capacitance values for the two nodes, thereby allowing partitioning at those nodes; 2) keeps "large" floating capacitors, thus keeping the two nodes in the same partition; and 3) for "medium" floating capacitors, are run in SMS mode, thereby allowing partitioning at those nodes.

A "cut node" is a node at the boundary of two or more stages that would not have been on a boundary without some type of "cut" operation. Cut operations split large partitions into smaller ones. When stages share a cut node, the corresponding stages are grouped together into an "cut group." There can be many stages in one cut group. Essentially, the matrices from the stages in a cut group are processed together (not separately, as in an SMS group), but they are processed more efficiently than if one large matrix was used.

Hierarchical Simulator of the Present Invention Utilizing Hierarchical Cuts to Form Subcircuits Embodiments of the present invention are drawn to an integrated circuit simulator that advantageously utilizes cut techniques that are based on circuit boundaries that are defined on the hierarchy of an input hierarchical netlist. Cut techniques divide a group of circuitry into smaller stages where manageable matrix computations can be applied and solved to compute node voltages therewithin. Operations of simulators are described in the following US patents which are all incorporated herein by reference: U.S. Pat. No. 5,446,676 entitled "Transistor-level Timing and Power Simulator and Power Analyzer," by Huang et al.; U.S. Pat. No. 5,553,008, entitled "Transistor-level Timing and Simulator and Power Analyzer," by Huang et al.; U.S. Pat. No. 5,872,952, entitled "Integrated Circuit Power Net Analysis Through Simulation," by Tuan et al.; U.S. Pat. No. 5,838,947, entitled "Modeling, Characterization and Simulation of Integrated Circuit Power Behavior," by Sarin; U.S. Pat. No. 5,740,347, entitled "Circuit Analyzer of Black, Gray and Transparent Elements," by Avidan; U.S. Pat. No. 5,878,053, entitled "Hierarchical Power Network Simulation and Analysis Tool for Reliability Testing of Deep Submicron IC Designs," by Koh et al.; and U.S. Pat. No. 6,009,250, entitled "Selective Flattening in Layout Areas in Computer Implemented Integrated Circuit Design," by Ho et al.

Figure 2:
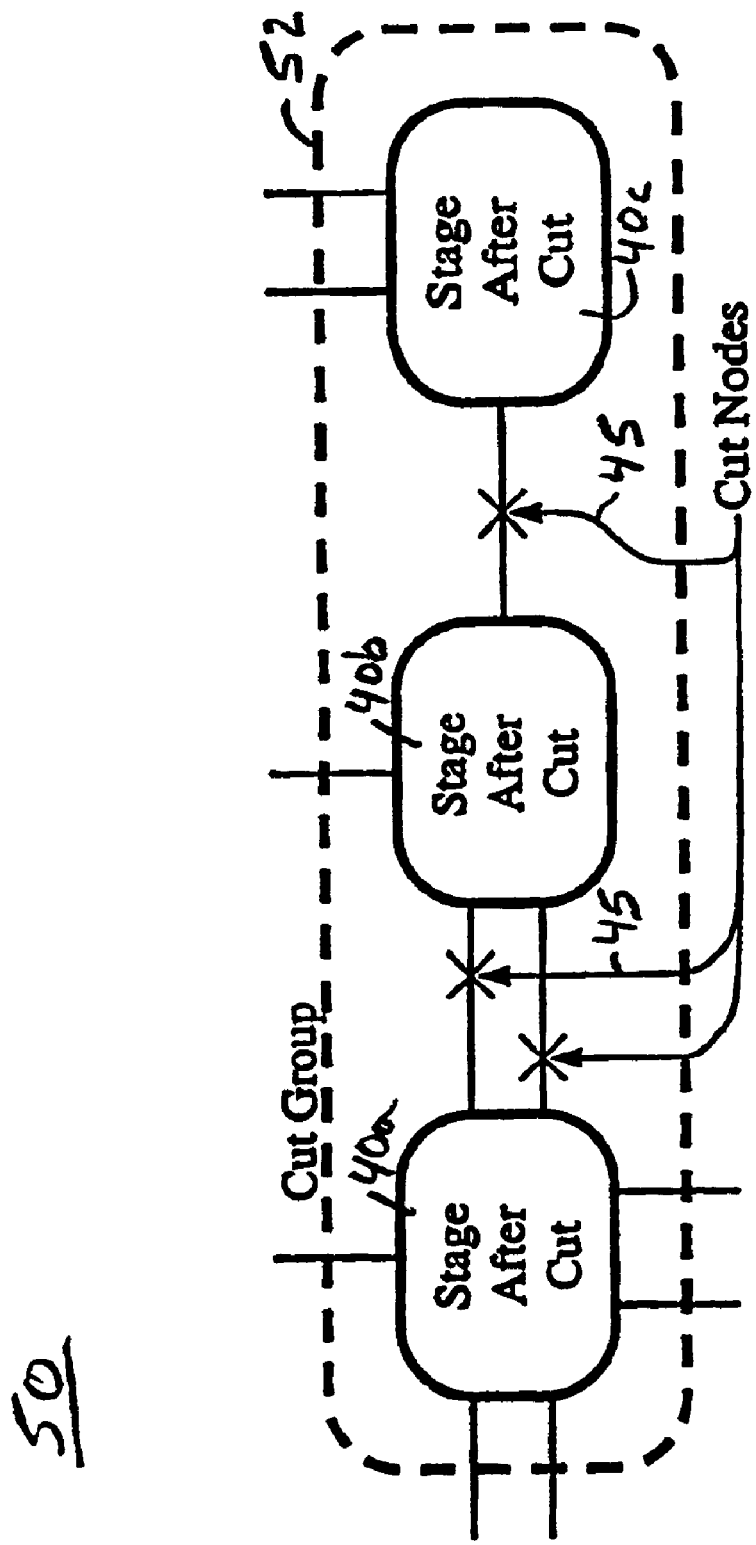
FIG. 2 illustrates an exemplary partition cut into three stages.

FIG. 2 illustrates an exemplary cut group 52 that includes three stages 40a–40c. After the stages have been cut, several cut nodes 45 remain. In accordance with the present invention, the stages are determined, in accordance with the present invention, based on hierarchical boundaries as to defined by an input hierarchical netlist.

One concept of the cutting technique employed by the present invention is to split a large and complex stage into a plurality of subcircuits 40a–40c, and then replace each of the subcircuits with its Thevenin equivalent circuit model. An equivalent matrix is then generated and solved, thereby providing the voltages at the cut nodes 45. Hence, the matrix that would represent the entire stage is transformed into a smaller matrix, and this is done without introducing errors.

The Thevenin equivalent circuit model of each subcircuit takes into account the present state of any internal sources and external input. Hence, a subcircuit's Thevenin equivalent is time-varying, and generally needs to be dynamically recalculated at each time step for which the subcircuit needs to be processed; the needed processing generally due to an event of some kind occurring on a controlling node of the partition. The subcircuits within the partition are connected at cut nodes, and, once the Thevenin equivalents are computed, the inputs to the partition are already taken into account and do not enter into further calculations for that time step of the partition.

The procedure according to one embodiment of the present invention for generating Thevenin equivalent circuits is now described. According to one embodiment, the generation of a Thevenin equivalent for a subcircuit s is done with the following steps. In the first step, a matrix equation, of the form $M_s x = y$, is generated for the subcircuit s. An example formulation designates the known vector y in terms of: voltages on capacitors from the previous time step (e.g., parallel current sources or series voltage sources); voltages on cut nodes (each subsequently treated as v+dv) from the previous time step; current and voltage sources; and voltages on input nodes (e.g., inputs from other stages computed via a different matrix). The unknown vector x is designated in terms of changes of voltages (dv) or voltages of nodes in the stage (including those output to other stages as controlling nodes); and current on the cut nodes.

The matrix $M_s$ is generated via Modified Nodal Analysis (MNA), and is constant for the subcircuit. It is appreciated that matrix $M_s$ should be generated before the simulation begins, undergoes triangular decomposition, and is stored as $L_s U_s$. Triangular decomposition (in the general case) is an $O(n^3)$ process, so doing the decomposition only once is highly advantageous.

In the second step, during the simulation, the voltages at the cut nodes are set to their values from the previous time step, $v_{1,i}$ and $v_{2,i}$ (e.g., $dv_{n,i}=0$ for each cut node n, "i" is for initial), and the matrix equation $L_s U_s x = y$ is solved by forward elimination and back substitution. This determines the currents $i_{n,s,i}$ at the cut nodes and $dV_{i,s}$ (internal) of the internal nodes (non-cut nodes), taking into account updated (e.g., at the current time step) source values and input node voltages. Forward elimination and back substitution are both $O(n^2)$ processes.

In the third step, for each of the cut node(s), $dv_n$ is set to 1 volt (or some other convenient value, hereinafter assumed to be 1 volt, called $v_{perturbed}$), while dv for the other cut nodes is 0 volts (e.g., in turn, each of the cut nodes has its voltage perturbed). The matrix equation is solved, thereby determining the perturbed current(s) $i_{m,n,s,i}$, for the nth cut node voltage being perturbed and the current observed at the mth cut node and $dV_{n,i,s}$ (internal) for the nth cut node voltage being perturbed and the change of voltage observed at the ith internal node.

With respect to the fourth step, for each combination of (n,m) in subcircuit s, the admittance, $g_{m,n,s}$, is determined according to:

$$\frac{i_{m,s}}{v_n} = \frac{i_{m,n,s,i} - i_{n,s,i}}{(v_{n,i} + dv_n) - V_{n,i}} = \frac{i_{m,n,s,i} - i_{n,s,i}}{v_{perturbed}} = i_{m,n,s,i} - i_{n,s,i} \quad \text{(EQ 1)}$$

The sensitivity, $V_{i,s}$ (internal)/$V_n$ is determined according to:

$$\frac{V_{i,s}(\text{internal})}{V_n} = \frac{V_{n,i,s}(\text{internal}) - V_{i,s}(\text{internal})}{V_{perturbed}} \quad \text{(EQ 1A)}$$

$$= V_{n,i,s}(\text{internal}) - V_{i,s}(\text{internal})$$

Admittance is the complex-number form of conductance, and conductance is the reciprocal of resistance. Completion of computing the Thevenin equivalent model would generally include determination of the open-circuit voltages, $V_{OC}$ (in addition to the admittances), but subsequent computations do not need the open-circuit voltages. This is true, because, in performing small signal analysis (a standard circuit analysis technique, similar to this analysis), voltage sources are shorted and current sources are opened. Also, the derivation in a subsequent section shows how the $V_{OC}$ terms cancel.

It is appreciated that steps 2, 3 and 4 for the above Thevenin equivalent computation are performed for each subcircuit in a stage. However, it is possible to eliminate some subcircuits from the computation if they are only connected to cut nodes through channels that are turned off.

The procedure according to one embodiment of the present invention for computing cut node voltages is described. The following procedure computes the changes in the voltages (the dv values) at the cut nodes, taking into account all the subcircuits within the stage. This is a continuation of the above procedure that begins with step 5.

FIG. 3 illustrates the matrix G 150 that is created by the process and the process then solves the equation Gdv=i. The matrix G 150 is formed by summing the corresponding admittances from each subcircuit (summed over the set S of subcircuits). The right-hand side of the equation (known values) is the sum of the cut node currents computed before the cut node voltages are perturbed. The vector of dv values is the set of unknowns we are trying to compute, and these are the changes in the cut node voltage taking into account all the subcircuits in the stage.

At first glance, this matrix equation is counter-intuitive, because, the sum of currents out of a node is zero (the Kirchhoff Current Law, KCL), and the right side of the equation is a sum of currents for each cut node. The question may be asked then, why is the vector not zero? The examples, below, give some intuition as to why this is not only correct, but yields an exact solution.

Figure 4:
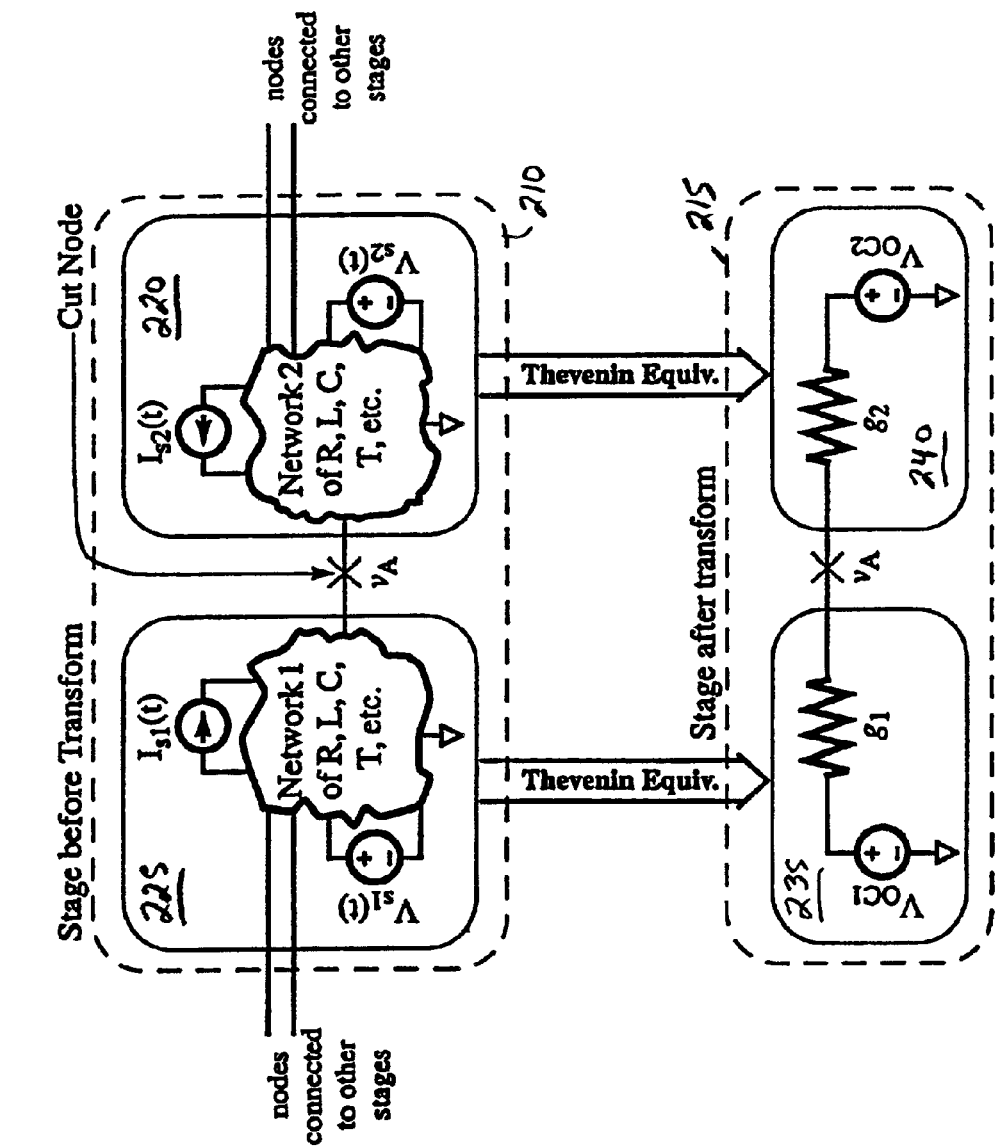
FIG. 4 is a diagram of a transformation of a stage into its Thevenin equivalent circuit model for a stage having two subcircuits in accordance with an embodiment of the present invention.

FIG. 4 illustrates a one port network example 200 in accordance with an embodiment of the present invention. FIG. 4 illustrates the transformation of a partition 210 composed of two subcircuits 225 and 220, where the subcircuits share one cut node (Va). In one embodiment, the subcircuits are cut based on hierarchical boundaries of the input netlist. Each subcircuit includes current and voltage sources and connections to other stages. The transformation to a Thevenin equivalent model for each subcircuit simplifies the stage to two resistors (g1 and g2) and two voltage sources (Voc1 and Voc2) all of which are time-varying, but are treated as constants for a particular moment in time. The transformed subcircuits include the effects of nodes connected to other stages, as well as any voltage and current sources. As seen in FIG. 4, solving for the voltage, Va, is a simple matter once the Thevenin equivalents have been found. What is shown is a derivation for a two-cut-node circuit in the following section.

Figure 5:
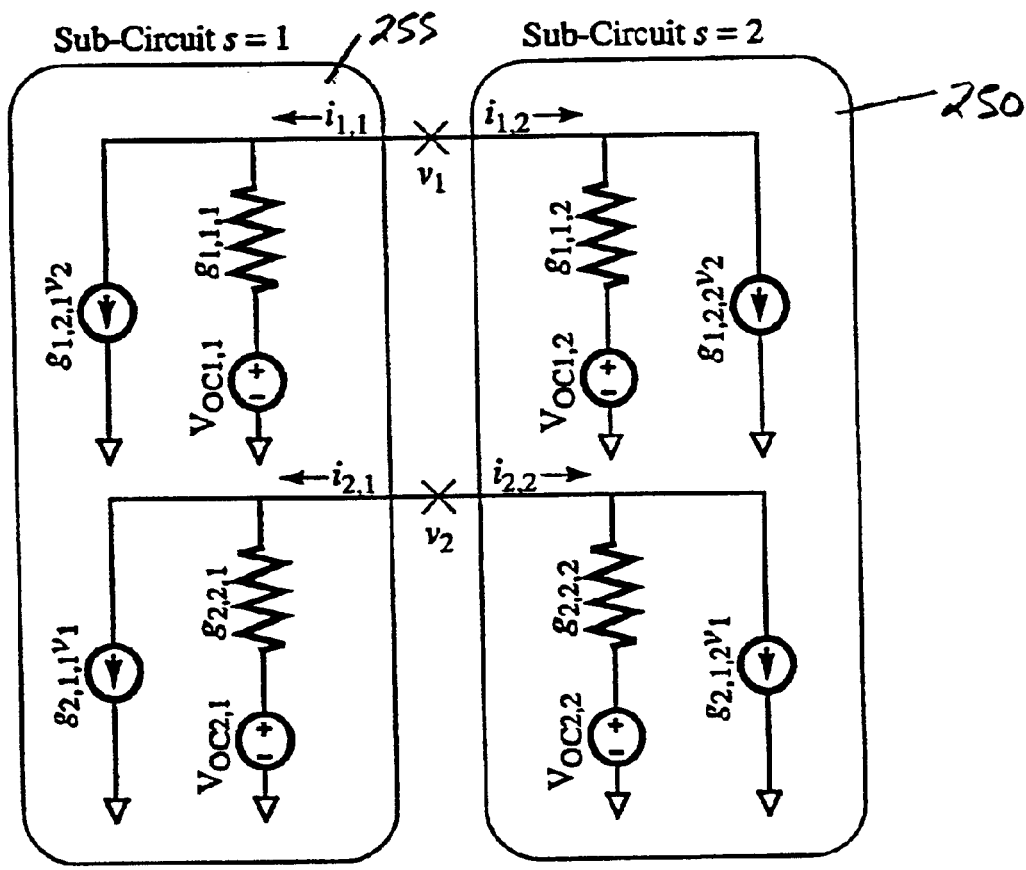
FIG. 5 is a diagram of a transformation of a stage into its two-port Thevenin equivalent circuit model where the subcircuits have two cut nodes in accordance with an embodiment of the present invention.

FIG. 5 illustrates a two-port network example 260 in accordance with an embodiment of the present invention. The objective of this section is to prove Equation 2 (of FIG. 3) for a two-subcircuit stage with two cut nodes. FIG. 5 shows a partition composed of two subcircuits, where the subcircuits shared two cut nodes. From steps 1 through 4, above, for subcircuit s=1, values have been computed to make the following equations true:

$$\boxed{i_{1,1,t} = g_{1,2,1} v_{2,t} + g_{1,1,1}(v_{1,t} - V_{OC1,1})} \quad \text{(EQ 3)}$$

$$\boxed{i_{2,1,t} = g_{2,2,1} v_{1,t} + g_{2,2,1}(v_{2,t} - V_{OC2,1})} \quad \text{(EQ 4)}$$

and for subcircuit s=2:

$$i_{1,2,t} = g_{1,2,2}v_{2,t} + g_{1,1,2}(v_{1,t} - V_{OCl,2}) \quad (EQ\ 5)$$

$$i_{2,2,t} = g_{2,2,2}v_{1,t} + g_{2,2,2}(v_{2,t} - V_{OC2,2}) \quad (EQ\ 6)$$

where: $v_{1,i}$ and $v_{2,i}$, are the voltages from the previous time step; $i_{1,1,i}$ and $i_{2,1,i}$ are the currents from the computation in step 4, above; and the $g_{m,n,s}$ and $V_{OCn,s}$ values are the parameters of the Thevenin equivalent models of the subcircuits. For use later, these four equations are rewritten as:

$$g_{1,1,1}v_{1,t} + g_{1,2,1}v_{2,t} = i_{1,1,t} + g_{1,1,1}V_{OCl,1} \quad (EQ\ 7)$$

$$g_{2,1,1}v_{1,t} + g_{2,2,1}v_{2,t} = i_{2,1,t} + g_{2,2,1}V_{OC2,1} \quad (EQ\ 8)$$

$$g_{1,1,2}v_{1,t} + g_{1,2,2}v_{2,t} = i_{1,2,t} + g_{1,1,2}V_{OCl,2} \quad (EQ\ 9)$$

$$g_{2,1,2}v_{1,t} + g_{2,2,2}v_{2,t} = i_{2,2,t} + g_{2,2,2}V_{OC2,2} \quad (EQ\ 10)$$

These two pairs of equations can be written as two matrix equations:

$$\begin{bmatrix} g_{1,1,1} & g_{1,2,1} \\ g_{2,1,1} & g_{2,2,1} \end{bmatrix} \begin{bmatrix} v_{1,t} \\ v_{2,t} \end{bmatrix} = \begin{bmatrix} i_{1,1,t} + g_{1,1,1}V_{OCl,1} \\ i_{2,1,t} + g_{2,2,1}V_{OC2,1} \end{bmatrix} \quad (EQ\ 11)$$

$$\begin{bmatrix} g_{1,1,2} & g_{1,2,2} \\ g_{2,1,2} & g_{2,2,2} \end{bmatrix} \begin{bmatrix} v_{1,t} \\ v_{2,t} \end{bmatrix} = \begin{bmatrix} i_{1,1,t} + g_{1,1,1}V_{OCl,2} \\ i_{2,2,t} + g_{2,2,2}V_{OC2,2} \end{bmatrix} \quad (EQ\ 12)$$

With respect to FIG. 5, applying KCL at node 1 and node 2, results in:

$$0 = i_{1,1} + i_{1,2} \quad (EQ\ 13)$$

$$= (g_{1,2,1}v_2 + g_{1,1,1}(v_1 - V_{OCl,1})) + (g_{1,2,2}v_2 + g_{1,1,2}(v_1 - V_{OCl,2})) \quad (EQ\ 14)$$

and:

$$0 = i_{2,1} + i_{2,2} \quad (EQ\ 15)$$

$$= (g_{2,1,1}v_1 + g_{2,2,1}(v_2 - V_{OC2,1})) + (g_{2,1,2}v_1 + g_{2,2,2}(v_2 - V_{OC2,2})) \quad (EQ\ 16)$$

To examine the change in voltage for the next time step, substitute $v_1 = v_{1,t} + dv_1$ and $v_2 = v_{2,t} + dv_2$ into Equation 14 and Equation 16, and get:

$$0 = g_{1,2,1}(v_{2,t} + dv_2) + g_{1,1,1}(v_{1,t} + dv_1 - V_{OCl,1}) + g_{1,2,2}(v_{2,t} + dv_2) + g_{1,1,2}(v_{1,1} + dv_1 - V_{OCl,2}) \quad (EQ\ 17)$$

$$0 = g_{2,1,1}(v_{1,t} + dv_1) + g_{2,2,1}(v_{2,t} + dv_2 - V_{OC2,1}) + g_{2,1,2}(v_{1,1} + dv_1) + g_{2,2,2}(v_{2,t} + dv_2 - V_{OC2,2}) \quad (EQ\ 18)$$

Distributing, commuting, and associating:

$$0 = (g_{1,1,1}v_{1,t} + g_{1,2,1}v_{2,t}) + g_{1,2,1}dv_2 + g_{1,1,1}dv_1 - g_{1,1,1}V_{OCl,1} + (g_{1,1,2}v_{1,t} + g_{1,2,2}v_{2,t}) + g_{1,2,2}dv_2 + g_{1,1,2}dv_1 - g_{1,1,2}V_{OCl,2} \quad (EQ\ 19)$$

$$0 = (g_{2,1,1}v_{1,t} + g_{2,2,1}v_{2,t}) + g_{2,1,1}dv_1 + g_{2,2,1}dv_2 - g_{2,2,1}V_{OC2,1} + (g_{2,1,2}v_{1,t} + g_{2,2,2}v_{2,t}) + g_{2,1,2}dv_1 + g_{2,2,2}dv_2 - g_{2,2,2}V_{OC2,2} \quad (EQ\ 20)$$

Now substitute Equation 7 through Equation 10 into these equations:

$$0 = (i_{1,1,t} + g_{1,1,1}V_{OCl,1}) + g_{1,2,1}dv_2 + g_{1,1,1}dv_1 - g_{1,1,1}V_{OCl,1} + (i_{1,2,t} + g_{1,1,2}V_{OCl,2}) + g_{1,2,2}dv_2 + g_{1,1,2}dv_1 - g_{1,1,2}V_{OCl,2} \quad (EQ\ 21)$$

$$0 = (i_{2,1,t} + g_{2,2,1}V_{OC2,1}) + g_{2,1,1}dv_1 + g_{2,2,1}dv_2 - g_{2,2,1}V_{OC2,1} + (i_{2,2,t} + g_{2,2,2}V_{OC2,2}) + g_{2,1,2}dv_1 + g_{2,2,2}dv_2 - g_{2,2,2}V_{OC2,2} \quad (EQ\ 22)$$

The terms with open circuit voltages (e.g., $V_{OC1,1}$) cancel, leaving:

$$0 = i_{1,1,t} + i_{1,2,t} + g_{1,2,1}dv_2 + g_{1,1,1}dv_1 + g_{1,2,2}dv_2 + g_{1,1,2}dv_1 \quad (EQ\ 23)$$

$$0 = i_{2,1,t} + i_{2,2,t} + g_{2,1,1}dv_1 + g_{2,2,1}dv_2 + g_{2,1,2}dv_1 + g_{2,2,2}dv_2 \quad (EQ\ 24)$$

Rearranging:

$$(g_{1,1,1} + g_{1,1,2})dv_1 + (g_{1,2,1} + g_{1,2,2})dv_2 = -(i_{1,1,t} + i_{1,2,t}) \quad (EQ\ 25)$$

$$(g_{2,1,1} + g_{2,1,2})dv_1 + (g_{2,2,1} + g_{2,2,2})dv_2 = -(i_{2,1,t} + i_{2,2,t}) \quad (EQ\ 26)$$

And, finally, in matrix form:

$$\begin{bmatrix} g_{1,1,1} + g_{1,1,2} & g_{1,2,1} + g_{1,2,2} \\ g_{2,1,1} + g_{2,1,2} & g_{2,2,1} + g_{2,2,2} \end{bmatrix} \begin{bmatrix} dv_1 \\ dv_2 \end{bmatrix} = \begin{bmatrix} -(i_{1,1,t} + i_{1,2,t}) \\ -(i_{2,1,t} + i_{2,2,t}) \end{bmatrix} \quad (EQ\ 27)$$

Thus, Equation 2 has been proven for the case of two cut nodes, as this is matrix equation equivalent. This derivation can be done for any number of cut nodes and any number of stages.

An intuitive explanation of the results is now presented. Looking at Equation 27, the RHS sum of currents represents "error terms." For example, $i_{1,1,i} + i_{1,2,i}$ is the net current flowing out of node 1, and this net current, it would seem, needs to be zero, by KCL. Rather, $i_{1,1,i} + i_{1,2,i}$ is interpreted as the amount of net current that needs to be compensated by changes in the cut node voltages, $dv_1$ and $dv_2$. This means $dv_1$ and $dv_2$ induce changes in currents $i_{1,1}$ and $i_{1,2}$ in order to make their sum equal to zero, thereby complying with KCL. The required amount of change in the net current is $-(i_{1,1,i}+i_{1,2,i})$, applying this change makes $i_{1,1}+i_{1,2}=0$.

The minus sign in $-(i_{1,1,i}+i_{1,1,i})$ is now discussed. If the "error" is positive, $i_{1,1,i}+i_{1,2,i}<0$, implying that without changing the cut node voltages, there would be net positive current out of node 1. Therefore, changes in the cut node voltages ($dv_1$ and $dv_2$) need to send current into node 1, and so the corresponding term in the LHS of the equation must be negative. Looking at node 1 in FIG. 5, it can be seen that decreasing v, (i.e., $dv_1<0$) will increase the current through $g_{1,1,1}$ into node 1 by increasing the voltage drop across the admittance. Similarly, decreasing $v_2$ (i.e., $dv_2<0$) will increase the current from the source $g_{1,1,1}v_2$ into node 1 by decreasing the current from the source. Thus, the arithmetic signs are appropriate because the admittance values ($g_{1,1,1}$, $g_{2,2,1}$, $g_{1,1,2}$, and $g_{2,2,2}$) are positive.

The matrix processing in the cutting process of the present invention does not introduce errors, so the selection of cut nodes does not matter. This fact is critically important for use in hierarchical simulation.

Computational efficiency is now presented. Consider a case where 100 subcircuits sharing 2 cut nodes, each subcircuit having 12 internal nodes. Hence, each subcircuit has 14 independent variables. For a cut in accordance with the present invention, each subcircuit is characterized by a 16×16 matrix (12 internal node voltages, 2 cut node voltages, and 2 cut node currents, where the cut node currents are "artificially" added to the matrix).

An example of such a situation is a column of 6T SRAM bit cells (including source and drain resistances) sharing two bit lines, where 100 of the cells have either their word line active or have not come to a stable internal state with the word line turned off. If solved as one large matrix, that matrix would be 1202×1202 (due to 100 set of 12 nodes, plus the 2 bit lines). The cut technique of the present invention changes this to performing the following: 1) LU factor 100 matrices that are 16×16 each, one for each subcircuit; 2) solve 100 matrix equations using the LU factored matrices to find the initial cut node currents; 3) solve 100 matrix equations, reusing the LU factored matrices, to find the cut node currents due to perturbed voltages; 4) form the matrix equation via Equation 2 by summing appropriate terms; 5) solve one matrix equation (Equation 2) with a 2×2 matrix to find the new cut node voltages; and 6) compute 100 sets of internal node voltages, each done by multiplying a 12×2 matrix (composed of partial derivatives of internal voltages with respect to the cut node voltages) by the 2×1 vector of the changes in cut node voltages (e.g., dv values for the cut nodes).

The cut technique of the present invention and hierarchical circuit boundaries are now discussed. Generally, integrated circuit designs are specified by a circuit designer in a hierarchical manner. However, in spice-like circuit simulators of the prior art, such as PowerMill, the circuit hierarchy is flattened, thereby having each transistor (and other elements) instance specified separately in a data structure, and also having each node voltage specified separately in a data structure. Changing the representation of the circuit connectivity from hierarchical to flat, as done in the prior art, drastically increases the required amount of computer memory. While the node voltages would still (generally) need to be stored in a flat manner, it would be highly advantageous to keep the circuit connectivity as a hierarchically organized data structure. The present invention accomplishes this.

Figure 6:
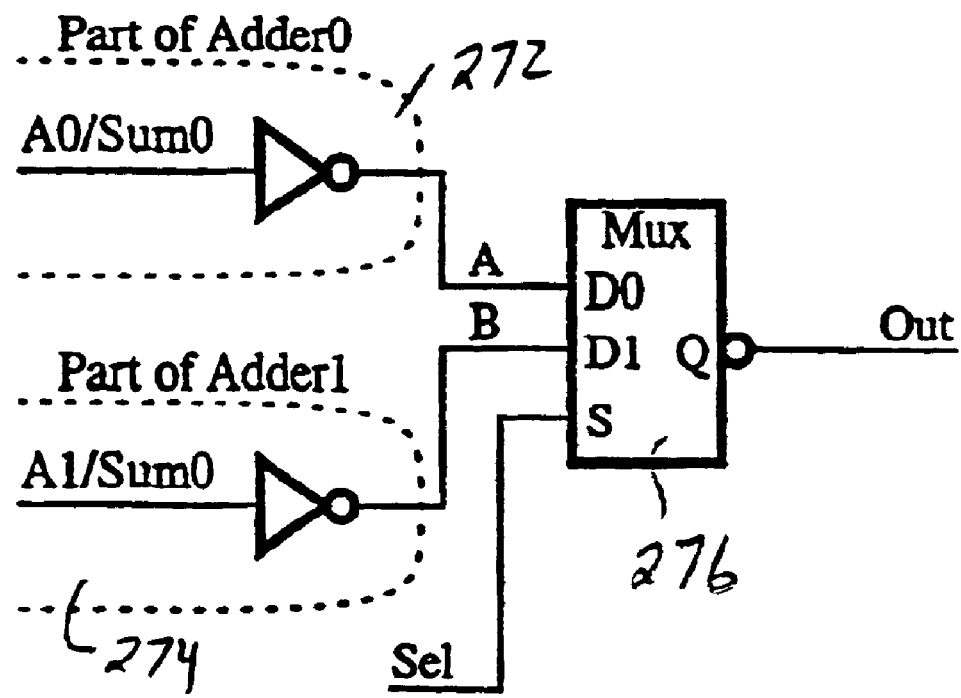
FIG. 6 is a circuit diagram of a flat representation of part of an exemplary hierarchical schematic in accordance with an embodiment of the present invention.
Figure 7:
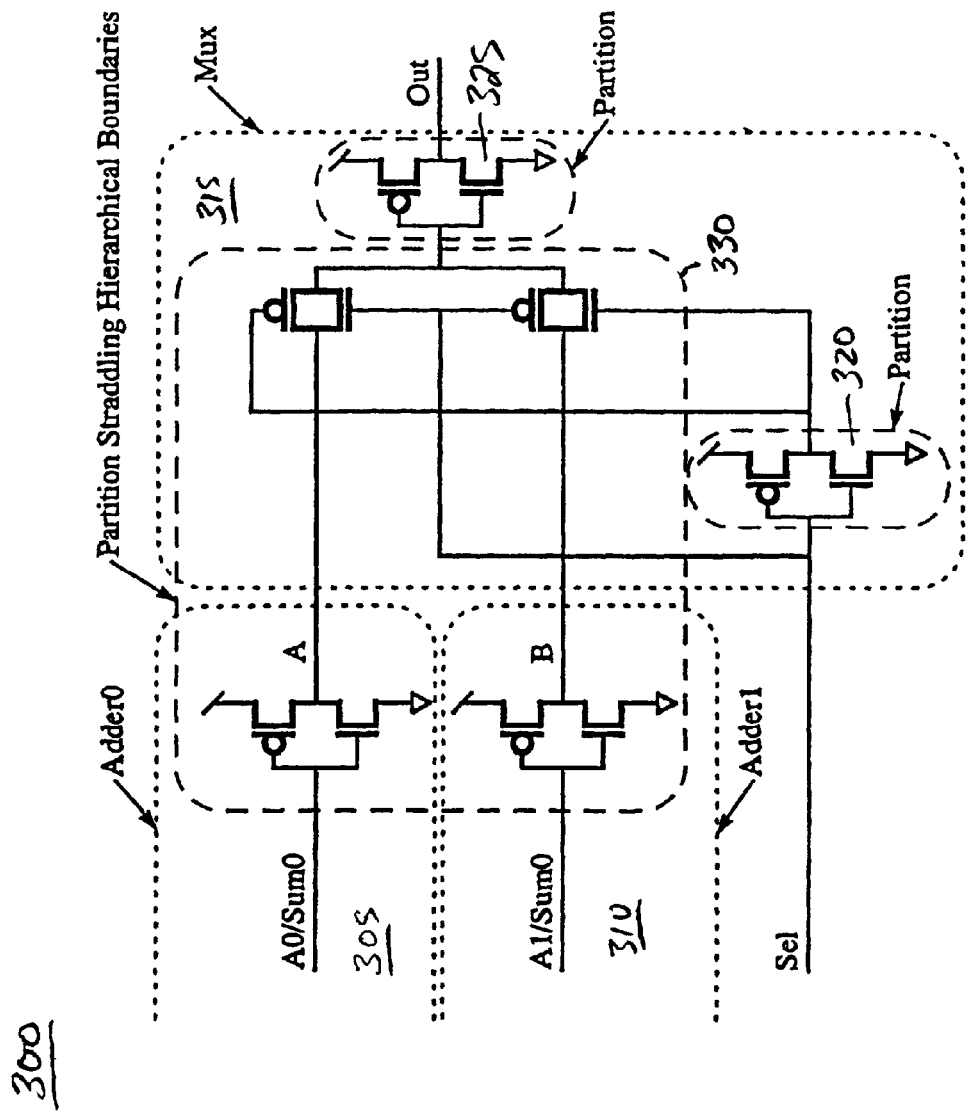
FIG. 7 illustrates an exemplary flat transistor circuit showing both hierarchical boundaries and channel connect partition boundaries.

An example is presented to illustrate using a hierarchical data structure for circuit connectivity. FIG. 6 shows a small part of a flat logic schematic 270, composed of two inverters 272 and 274 and an inverting multiplexor 276, and FIG. 7 shows the corresponding flat transistor schematic 300. Using channel connect partitioning, the transistor channels connected to nodes UA" and "B" are put into a stage comprising eight transistors. As shown in FIG. 7, that particular stage 330 straddles the boundaries of the hierarchical circuit connectivity, which is emphasized in FIG. 8 which illustrates a portion of the hierarchical tree of an input netlist.

In FIG. 7, the small dashed lines represent an area set by the hierarchical boundary in accordance with the present invention whereas the larger dashed lines represent channel connectivity boundaries.

Figure 8:
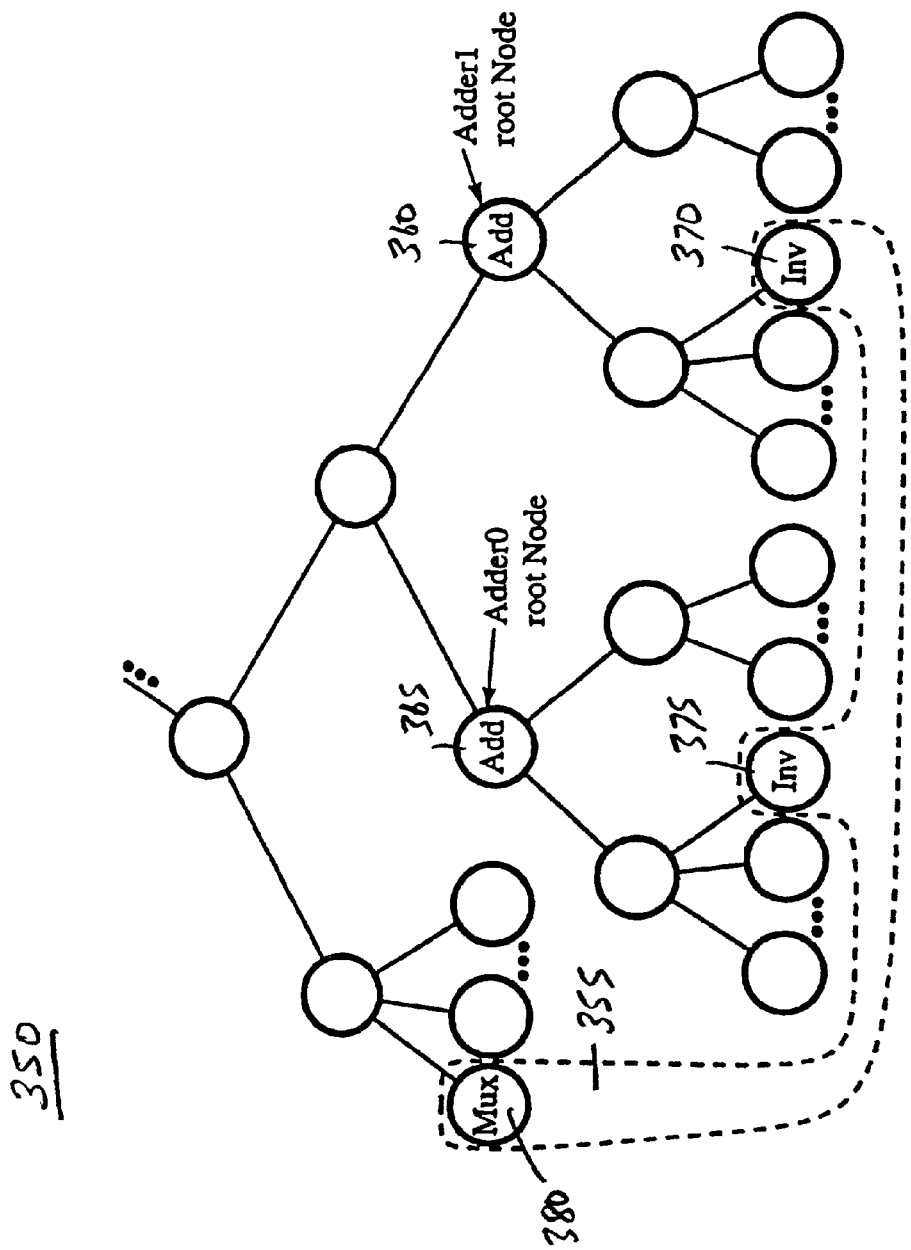
FIG. 8 is a tree describing the hierarchical schematic corresponding to FIG. 6 in accordance with an embodiment of the present invention.

For efficient simulation, static per-stage information needs to be stored in memory. If two stages are identical, they can share their static per-stage information in accordance with the present invention. For example, two stages, each entirely composed (e.g., nothing else is in the stage) of the same single logic gate, can share their static per-stage information. When stages straddle hierarchical boundaries (as shown in FIG. 8), the static per-stage information could, in theory, be shared; however, this would require identifying the occurrence of identical stages, which is a very difficult pattern recognition problem. The problem is having millions of stages and having to compare them to each other to find the ones that are identical.

By using hierarchical boundaries as the division point, the present invention avoids this difficult pattern recognition problem. Because the present invention partitions stages at the hierarchical boundaries (rather than by channel connect), then the difficult pattern recognition problem does exist because the circuit hierarchy already identifies identical cells. As shown above, the cut process of the present invention provides a means to cut a partition into smaller stages at any node, without introducing compromises in the accuracy of the resulting voltage and current computations. Therefore, the cut process of the present invention can be used so that stages can exactly match the hierarchical boundaries of the circuit connectivity specified by the designer.

This use of the cut process of the present invention enables an entire integrated circuit to be simulated in a hierarchical fashion. That is, the circuit connectivity can be store hierarchically because static per-stage information can be shared among identical branches of the hierarchical description of the circuit.

Because identical cells can drive the inputs of substantially different cells, the type of cell cannot be used to determine whether the cut technique of the present invention needs to be invoked. An example of this is a pair of identical inverters: one inverter driving a gate input, the other inverter driving a transmission gate input. Since the voltages need to be stored as a flat data structure (e.g., voltage is separately tracked for each node), an indicator can be stored with the node voltage indicating the node is a cut node.

Flow Diagram

FIG. 9 illustrates a flow diagram 400 of one embodiment of the present invention. Flow diagram 400 can be represented as computer code stored in computer readable memory and executed by a processor of a general purpose computer system. Process 400 illustrates steps of the cut technique of the present invention. At step 405, an input netlist is accessed. The netlist is organized in a hierarchy of cells, one example of which is shown in FIG. 8. In this hierarchy, many instances of the same cell are used, e.g., cell instances 375 and 370 are of the same inverter. Further, adder instance 365 and adder instance 360 are of the same group of cell instances. At step 410 of FIG. 9, connectivity information is stored as a data structure in memory. The connectivity information outlines the manner in which the cell instances of the input hierarchical netlist are coupled together. The connectivity information is a static database.

Figure 10:
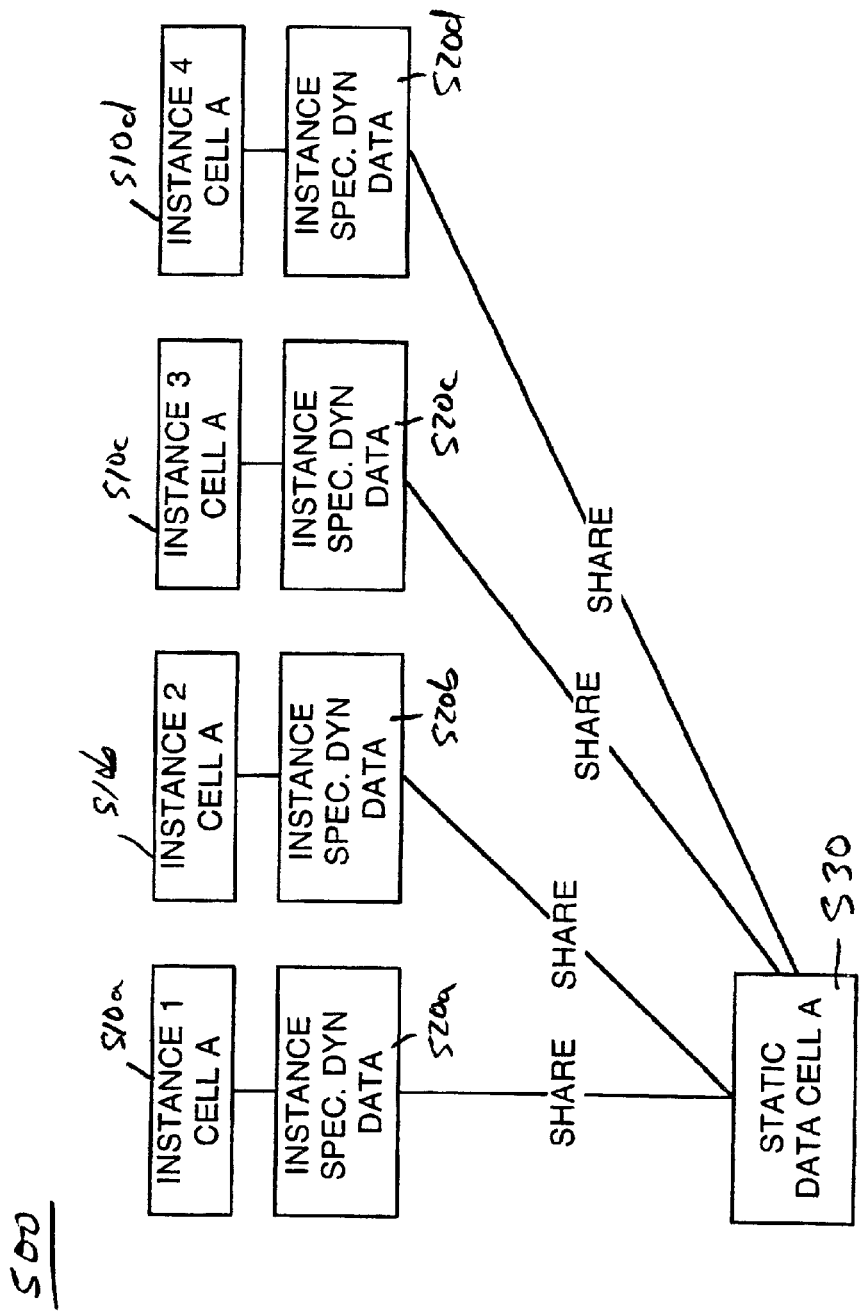
FIG. 10 illustrates one manner in which static information can be shared between instances of a same cell thereby reducing memory resources required of the circuit simulator of one embodiment of the present invention.

FIG. 10 illustrates that the present invention stores both static and dynamic data structures. Static data structures 530 can be shared across instances of the same cell. As shown, static data structure 530 is shared across cell instances 510a–510d. By sharing static data structure 530, the present invention significantly reduces the amount of memory resources required to perform circuit simulation. The static data structure 530 contains: 1) connectivity information; 2) model parameters; and 3) matrix formulations for the cell. This information is not time varying and is also the same for each instance of a same cell.

For each cell instance, the present invention maintains a separate dynamic information that is time varying. As an example, a separate data structure 520a–520d is maintained for each respective cell instance 510a–510d. These data structures contain instance specific dynamic information for the associated cell. The dynamic information 520 includes: 1) node variables and states; 2) node voltages; 3) node currents; 4) and branch currents. Dynamic information is stored in a flattened way and static information is shared and stored in a hierarchical fashion by the present invention.

At step 415 of FIG. 9, an event is detected. An event, generally, represents a change of a signal state in an event-driven simulator. At step 425, the present invention then examines the circuitry where the event is seen and the circuitry that is effected by the event. This involves connectivity information between the cells and also the cell contents are examined, e.g., using a local flattening procedure. Simulation produces a group of leaf cells that are touched by the event.

At step 430, the leaf cells of the identified group are cut by the present invention based on hierarchical boundaries into subnetworks (e.g., cut stages). The hierarchical boundaries are determined based on the hierarchical netlist contents. Cut nodes are also identified. At step 440, for each resultant stage or subnetwork, the present invention computes a Thevenin equivalent circuit in the manner previously described herein. After the Thevenin equivalent circuit model is computed, a sensitivity vector is produced that describes the way in which node voltages inside the cut stage change based on changes in the cut node voltages (e.g., partial derivatives). The cut node voltages are then computed at step 440. In computation of step 440, any static information for a stage is reused from a similar stage to reduce memory consumption on the part of the present invention.

Step 440 is performed for all cut stages. It is appreciated that if an instance has already had a Thevenin equivalent model computed for it, then on subsequent passes of step 440, the already produced Thevenin equivalent circuit can be reused and shared across all of the same instances.

At step 450 of FIG. 9, the sensitivity vector for a cut stage may be used to compute the internal node voltages of the cut stage. At step 460, the simulator of the present invention then updates the node voltage database for all node voltages computed. Also, at step 460, all instance specific dynamic information relating to the event are updated. For instance, at step 460, node voltages are stored in a flat node voltage data structure that is dynamic. It is appreciated that the scope of node voltages that are computed by the simulator may be user controlled, e.g., user specified.

At step 470, new events may be received, and/or, the node voltages (e.g., stimulus) that were computed for a prior event may be treated as new events. In any case, if a new event is to be processed, then an event is selected and step 415 is entered. If all events are over, then process 400 returns.

An advantage of the present invention is that the structural, e.g., static data, of the input netlist does not need to be flattened in order for the simulation to operate. By avoiding this flattening requirement (that is required of the prior art), the present invention can operate using significantly less memory resources over a prior art simulator.

Certain Advantages

Thevenin equivalent circuit can be used when adjacent partitions both have channels connected to a node and this is an advantage of the cut technique of the present invention. The cut technique of the present invention may only need to be used when two (or more) stages each have a channel that connects to the same node(s). That is, cut technique of the present invention handles the exceptional case (such as transmission gate logic, memories, and various analog circuits). Hence, for circuits composed of logic gates which all have driven outputs, the stages created from the hierarchical circuit connectivity are identical to the stages that would be created by a channel-connect process; this means the cut technique of the present invention that computes Thevenin equivalents may not be invoked. This is important because computing voltages for a group of stages via Thevenin equivalents is generally more computationally expensive than similarly sized stages (that are not channel connected) that can be simulated with independent matrices.

Regarding hierarchical extraction, post-layout extraction with parasitics can be done hierarchically, but has not been done up to now because simulation tools could not take advantage of a hierarchical database (other than to reduce the amount of input data). This is because conventional simulators flatten a hierarchical database; so there is no advantage afforded by the effort of doing hierarchical extraction because the simulation tools that use the data will flatten it anyway. However, the cut procedure of the present invention makes hierarchical extraction a useful operation. In essence, a set of identical leaf cells that have identical layouts have identical internal parasitic elements, and these parasitic elements can be extracted once and shared among the set of identical leaf cells.

Parasitic elements that are not identical for the set of leaf cells (such as capacitive coupling to signal routing that are on metal layers above the set of cells) can be stored in a flat data structure, and these parasitic elements can be added to the matrices of the hierarchically described circuit. This means designer-specified circuit elements are stored hierarchically, local parasitic elements are stored hierarchically, and parasitics between leaf cells are stored in a flat data structure. Alternatively, all parasitic elements could be stored in a flat data structure. Sufficiently significant parasitics (such as capacitive coupling between two very long parallel signal lines) may cause otherwise non-channel-connected leaf cells to be grouped, thereby being able to utilize the cut technique of the present invention.

Embodiments Using Various Simulation Methods

It is appreciated that the cut technique of the present invention can be combined with other simulation methods. For instance, event driven simulation multi-rate simulation, multi-mode simulation and synchronous matrix solving mode simulation can be used. The cut technique of the present invention can be combined with event driven method as shown in the pseudo code of Table I. In terms of hierarchical simulation, only parts of circuit which are active (driven by some events) need to evaluated. Hence, stages whose voltages are not changing are not evaluated, thereby saving computation.

Multi-rate simulation means using a different length of time step in different stages within the circuit. Selection of the time step for a particular stage during the simulation depends on many factors such as: the type of circuit (e.g., digital, sense amps, power converter, phase-locked loop, etc.); the desired precision (higher precision generally means using a smaller time step); the rate of change in the voltages (when voltages are changing rapidly, smaller time steps should be used); the simulation models used (e.g., piecewise linear, lumped capacitance, distributed capacitance, inclusion or exclusion of sub-threshold effects, etc.); and user-supplied simulation parameters (e.g., minimum or maximum time step, minimum voltage change needed to generate an event, voltage-current curves for devices, etc.).

The multi-rate methods previously used to simulate a set of static channel-connected stages can be applied to different group of leaf cells by using the cut technique of the present invention. The groups are determined by recursively search the shared cut nodes, as discussed in line 16 of the pseudo code of Table I. By using different time step based on the circuit properties of the groups (e.g., digital vs. analog), overall performance can be increased.

It is advantageous to model different parts of a circuit with differing levels of precision, and this is called multi-mode simulation. This is done to focus computational effort on parts of the circuit where added precision is desired. For example, in simulating a mixed analog and digital circuit, more sophisticated (and computationally expensive) models can be used for the analog section. These more sophisticated models can include things such as gate-to-drain capacitance values (versus lumped node capacitances). Very simple models can model MOS transistors as resistors, capacitors, and an ideal current sources, thereby reducing a stage to an RC circuit. The cut technique of the present invention is compatible with multi-mode simulation methods.

It is sometimes advantageous to synchronize events that affect multiple stages. In essence, this "synchronous matrix solving" mode forces matrices for multiple stages to be solved in lock-step, thereby eliminating artificial race conditions due to simulating parallel (in time) events on a sequential processor. The cut technique of the present invention is compatible with synchronous matrix solving simulation methods.

An optimization includes ignoring circuits across turned-off channels. For instance, while solving the cut node using equation (2) by summing the admittances and cut node currents from each leaf cell, if a leaf cell is connected to a cut node through a channel that is turned off (e.g., an "off" pass transistor), the current and admittance contribution from this cell is zero, and can be ignored. Thus, while a particular leaf cell is channel connected to a cut node, if that channel is not active, that leaf cell is ignored. This can be done in embodiments of the present invention to save computation.

Lookup Table Embodiment

With respect to using a lookup table approach to Thevenin equivalent determination, in one embodiment, the state of a sub-circuit is an ordered set of the voltages on its nodes. Other n-tuples are possible, but using the voltages is the most intuitive. There is a one-to-one correspondence between a particular state of a sub-circuit and its Thevenin equivalent. Therefore, it is possible to generate the Thevenin equivalent via lookup table. For example, an inverter can be characterized to two voltages, so a two-parameter lookup table can generate the Thevenin equivalent without any computation. For sub-circuits with more parameters, the number of elements in the lookup table would expand considerably. As a solution to this, non-uniform sampling (in voltage or current) of the parameters would reduce the size of the lookup table. The lookup table embodiment would be most effective for sub-circuits that get used often and can take advantage of the cut technique of the present invention. The best example of this type of sub-circuit is a RAM cell.

Pseudo-Code Representation

Presented below in Table I is a pseudo-code representation of one embodiment of the present invention. This represents a portion of a simulation process using the cut technique of the present invention. This pseudo-code is for the inner loop that processes an event on a node, and illustrates the ability to store the circuit connectivity in a hierarchical data structure and the node voltages in a flat data structure.

The pseudo-code of Table I assumes the hierarchical connectivity data structure includes: 1) connectivity of the entire circuit, described hierarchically; 2) pointers for traversing the hierarchical tree of cells, in both the upward (toward the root cell) and downward (toward the nodes in the leaf cells); and 3) enough information to generate a matrix for each type of leaf cell, sharing where possible (e.g., transistor models, etc.).

The pseudo-code of Table I also assumes the flat voltage data structure includes, for each node: 1) the node voltage; 2) an indicator for the condition of being a cut node (this is determined before the simulation begins, and is, generally, any node that is channel-connected to more than one leaf cell); 3) an indicator for the condition of being an output node (a node connected to multiple leaf cells, but channel connected to only one leaf cell), thereby being a node that can have events associated with it. It is appreciated that the pseudo-code representation is but one exemplary implementation of the present invention and many other implementations are possible.

TABLE I 1. get events from input vector, put them into event queue;
2. while the event queue is not empty {
3.    get a event including event node from the event queue;
4.    sequentially select each leaf cell attached to event node not yet processed for this event {
5.       get selected leaf cell from hierarchical connectivity data structure;
6.       if leaf cell does not affect any cut nodes } // solve in the usual manner
7.       for each node in leaf cell {
8.          get node voltage from flat voltage data structure;
9.       }
10.       construct the matrix equation for this leaf cell, $M*x = I$;
11.       for each element in the cell {load numerical parameters into the matrix;)
12.       solve matrix equation;
13.       update note voltages in flat voltage data structure;
14.       check for generation of new events, insert any new events into the event queue;

TABLE I-continued

```
15.         } else { // leaf cell touches at least one cut node
16.             recursively determine a set of group leaf cells
                    that share cut nodes with the selected
                    leaf cell; // groups can be determined
                    during setup for simulation
17.             sequentially select each group leaf cell {
18.                 for each node in selected group leaf cell {
19.                     get node voltage from flat voltage data
                            structure;
20.                 }
21.                 construct the matrix for selected group leaf
                        cell, M*x = I;
22.                 for each element in the cell {load numerical
                        parameters into the matrix;}
23.                 for each cut node in the cell {load the pseudo
                        voltage source into the matrix}
24.                 // hence, x is a vector of unknowns for the dv
                        of the internal and cut voltages,
25.                 // and current of the pseudo voltage source
26.                 LU factorize the matrix for the sub-circuit, M =
                        L*U, as discussed step 1;
27.                 set the voltages at the cut nodes to their
                        values from last time step (i.e., dv = 0),
                        and solving L*U*x = I by forward
                        elimination and backward substitution,
                        obtaining the i0 of the pseudo voltage
                        source, as discussed step 2;
28.                 for each cut node n {
29.                     set dv(n) to 1 volt, while keep dv of other
                            cut nodes to 0 volts. The new equation
                            L*U*x = I' is solved, resulting in the
                            perturbed current of the pseudo voltage
                            source and the perturbed dv of the
                            internal nodes, as discussed in step 3;
30.                     determine the admittance g(n, m) by performing
                            Equation (1), and determine the
                            sensitivity matrix of internal nodes vs.
                            cut nodes (that is, dv(internal)/dvm).
                            Note here g(n, m) is the Thevenin
                            equivalent of the selected group leaf
                            cell.
31.                 }
32.             }
33.             construct matrix G, and solve the equation G*dv = i
                    to obtain the cut voltages by solving
                    Equation 2;
34.             update cut node voltages in flat voltage data
                    structure;
35.             check for generation of new events, insert any new
                    events into the event queue;
36.             for each group leaf cell {
37.                 use the sensitivity matrix to determine internal
                        node voltages of the cell;
38.                 update internal node voltages in flat voltage
                        data structure;
39.             }
40.         }
41.     }
42. }
```

It is appreciated that in the above pseudo-code of Table I, reading a node from the event queue removes it from the queue.

The foregoing descriptions of specific embodiments of the present invention, system and method for simulation of an integrated circuit design using a hierarchical input netlist and divisions along hierarchical boundaries thereof, have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A computer implemented method of simulating an integrated circuit design comprising the steps of:
    a) accessing an input netlist describing said integrated circuit design, said input netlist organized in a hierarchical fashion;
    b) in response to an event, determining a group of leaf cells of said netlist that are effected by said event;
    c) of said group of leaf cells, dividing said group into stages based on hierarchical boundaries as defined in said netlist;
    d) transforming each of said stages into a separate Thevenin equivalent circuit model;
    e) using said circuit models to compute cut node voltages of said stages and recording, in computer memory, said cut node voltages; and
    f) repeating said steps b)–e) for multiple events.

2. A method as described in claim 1 wherein an event is a change of state of a signal.

3. A method as described in claim 1 wherein said step d) further comprises the step of generating a sensitivity vector for a stage.

4. A method as described in claim 3 wherein said step e) comprises the step of computing internal node voltages of a stage based on said sensitivity vector for said stage and said cut node voltages of said stage.

5. A method as described in claim 1 wherein said step b) reuses any previously computed static information pertinent to instances of a same cell in order to reduce memory consumption.

6. A method as described in claim 1 wherein said step d) reuses any previously computed circuit model information pertinent to instances of a same cell in order to reduce memory consumption.

7. A method as described in claim 1 wherein connectivity information describes connections between cells of said input netlist and wherein said step b) utilizes said connectivity information to determine said group of leaf cells.

8. A computer implemented method of simulating an integrated circuit design comprising the steps of:
    a) accessing an input netlist describing said integrated circuit design, said input netlist organized in a hierarchical fashion of cells and comprising connectivity information that describes connections between said cells;
    b) in response to an event, using said connectivity information to determine a group of leaf cells of said netlist that are effected by said event; c) of said group of leaf cells, dividing said group into stages based on hierarchical boundaries as defined in said netlist;
    d) transforming each of said stages into a separate Thevenin equivalent circuit model;
    e) using said Thevenin equivalent circuit models to compute cut node voltages of said stages and recording, in computer memory, said cut node voltages into a flat node voltage data structure; and
    f) repeating said steps b)–e) for multiple events.

9. A method as described in claim 8 wherein an event is a change of state of a signal.

10. A method as described in claim 8 wherein said step d) further comprises the step of generating a sensitivity vector for a stage.

11. A method as described in claim 10 wherein said step e) comprises the steps of:

computing internal node voltages of a stage based on said sensitivity vector for said stage and said cut node voltages of said stage; and storing said internal node voltages into an instance specific dynamic data structure.

12. A method as described in claim 8 wherein said step b) reuses any previously computed static information pertinent to instances of a same cell in order to reduce memory consumption.

13. A method as described in claim 8 wherein said step d) reuses any previously computed Thevenin equivalent circuit model information pertinent to instances of a same cell in order to reduce memory consumption.

14. A computer system comprising a processor coupled to bus and a memory coupled to said bus, wherein said memory contains instructions that when executed implement a method of simulating an integrated circuit design comprising the steps of:

a) accessing an input netlist describing said integrated circuit design, said input netlist organized in a hierarchical fashion;

b) in response to an event, determining a group of leaf cells of said netlist that are effected by said event;

c) of said group of leaf cells, dividing said group into stages based on hierarchical boundaries as defined in said netlist;

d) transforming each of said stages into a separate Thevenin equivalent circuit model, where appropriate;

e) using said circuit models to compute cut node voltages of said stages and recording, in computer memory, said cut node voltages; and f) repeating said steps b)–e) for multiple events.

15. A computer system as described in claim 14 wherein an event is a change of state of a signal.

16. A computer system as described in claim 14 wherein said step d) of said method further comprises the step of generating a sensitivity vector for a stage.

17. A computer system as described in claim 16 wherein said step e) of said method comprises the step of computing internal node voltages of a stage based on said sensitivity vector for said stage and said cut node voltages of said stage.

18. A computer system as described in claim 16 wherein said step e) of said method comprises the steps of:

computing internal node voltages of a stage based on said sensitivity vector for said stage and said cut node voltages of said stage; and storing said internal node voltages into an instance specific dynamic data structure.

19. A computer system as described in claim 14 wherein said step b) of said method reuses any previously computed static information pertinent to instances of a same cell in order to reduce memory consumption.

20. A computer system as described in claim 14 wherein said step d) of said method reuses any previously computed circuit model information pertinent to instances of a same cell in order to reduce memory consumption.

21. A computer system as described in claim 14 wherein connectivity information describes connections between cells of said input netlist and wherein step b) utilizes said connectivity information to determine said group of leaf cells.

* * * * *